United States Patent [19]

Hiramoto

[11] Patent Number: 4,482,395
[45] Date of Patent: Nov. 13, 1984

[54] SEMICONDUCTOR ANNEALING DEVICE

[75] Inventor: Tatsumi Hiramoto, Himeji, Japan

[73] Assignee: Ushio Denki Kabushikikaisha, Tokyo, Japan

[21] Appl. No.: 485,373

[22] Filed: Apr. 15, 1983

Related U.S. Application Data

[63] Continuation of Ser. No. 221,763, Dec. 31, 1980, abandoned.

[30] Foreign Application Priority Data

Feb. 1, 1980 [JP] Japan .................................. 55-9965

[51] Int. Cl.³ ........................................ H01L 21/324
[52] U.S. Cl. .................................. 148/1.5; 29/576 T
[58] Field of Search ..................... 29/576 T; 148/1.5; 427/35, 53.1, 55; 362/217, 267, 304, 305; 250/492.2

[56] References Cited

U.S. PATENT DOCUMENTS

| | | | |
|---|---|---|---|
| 3,763,348 | 10/1973 | Costello | 362/217 X |
| 4,151,008 | 4/1979 | Kirkpatrick | 250/492.2 X |
| 4,238,685 | 12/1980 | Tischer | 250/492.2 |
| 4,331,485 | 5/1982 | Gat | 427/53.1 X |
| 4,356,384 | 10/1982 | Gat | 219/354 X |

Primary Examiner—Brian E. Hearn
Assistant Examiner—Alan E. Schiavelli

[57] ABSTRACT

An annealing method wherein an elongated irradiation area is formed by a light source whose emitted light is controlled so that a peak curve of the illuminance distribution in the area may be substantially linear and that equiluminous curves near the peak curve may be substantially parallel therewith. A semiconductor wafer and the irradiation area are moved relative to each other in such a manner that the entire area of the semiconductor wafer to be annealed may cross all the equiluminous curves, thereby to achieving the annealing of the semiconductor wafer. With this annealing method, semiconductor crystals are satisfactorily recovered from damages incidental to ion implantation into the semiconductor wafer and polycrystalline or amorphous semiconductors are converted into single crystal semiconductors of good quality.

7 Claims, 8 Drawing Figures

SEMICONDUCTOR ANNEALING DEVICE

This application is a continuation of application Ser. No. 221,763, filed Dec. 31, 1980, now abandoned.

BACKGROUND OF THE INVENTION

1. Field of the Invention

The present invention relates to a method for annealing semiconductors, in particular, silicon (Si), germanium (Ge), gallium arsenide (GaAs) and so forth.

2. Description of the Prior Art

At present, annealing is drawing the attention of the semiconductor industry in two aspects. One is for the restoration of semiconductor crystals from damages which are caused, for example, by ion implantation of boron and the other is the use of high energy into a silicon wafer with a view to crystallization of a semiconductor element and providing it with a novel function. The most common traditional way of annealing is what is called the electric furnace method, in which the wafer is heated in a furnace, for instance, at 1000° C. for 30 minutes while supplying thereinto dry nitrogen. This method is simple, but it has such defects as follows:

(a) it causes warps in the wafer, thus affecting the productive yield in the ensuing processes;

(b) as heating requires a prolonged time, the interior of the wafer is subject to changes in the ion distribution;

(c) the surface of the wafer is apt to be contaminated; and (d) prolonged time is needed for annealing. In view of these defects, alternatives therefor are now being sought, e.g., by the application of laser rays for brief exposure of the subject wafer thereto. Laser ray annealing, however, such as in the case of using a pulse-oscillation laser, also has the following defects:

(e) the distribution of the implanted ions is subject to substantial changes as their diffusion rate is extremely high in the liquid phase, though the crystal restoration is effected because of the fusion of the wafer surface and the achievement of its crystallization through the liquid epitaxial growth;

(f) because the radiated light is of a single wavelength, there occurs an interference pattern in the melting area, leading to the uneven irradiation on the wafer;

(g) in the case of emloying a continuous oscillation laser, it means the scanning of a small beam spot on the wafer, resulting in producing a portion wanting sufficient annealing in the linear boundaries between scanning lines, and if the space between the scanning lines is reduced, the scanning takes much time and often yields overheated portions, thus causing such a disadvantage as uneven irradiation; and (h) because of the laser light being of a single wavelength, an interference pattern is developed on the wafer surface to cause uneven irradiation, and also as a common defect of the laser ray annealing methods, they call for large and precise equipments and further advanced techniques for operation.

The other annealing is for producing, for instance, a silicon wafer by the epitaxial growth of a silicon layer which is deposited on a suitable substrate by means of the ion evaporation technique. The annealing, in such a case, was hitherto performed in the same manner as above mentioned, that is, in an electric furnace, or by exposing the wafer to the laser ray, and in this case, there are the same defects as previously mentioned.

SUMMARY OF THE INVENTION

The present invention is to provide a novel method for annealing semiconductor wafers.

Briefly stated, according to the present invention, a lamp irradiation area is formed in which a peak curve of the illuminance distribution is substantially linear and equiluminous curves near the peak curve are almost parallel therewith, and a semiconductor wafer and the irradiation area are moved relative to each other in such a way that the whole area of the semiconductor wafer to be annealed may cross all the equiluminous curves.

The reasons for utilizing the irradiation by a lamp are as follows: For example, as shown in FIG. 6, a xenon long-arc lamp exhibits a marked spectral emission characteristic over a wavelength range of 2000 to 12000Å. When the lamp is combined with a water-pipe-like mirror, the emitted light can be focused with high efficiency. Further, by providing a light adjusting circuit in a drive power source for the lamp as shown in FIG. 7, the amount of light emitted can be adjusted relatively easily. In addition, since the semiconductor wafer possesses a great absorption characteristic over the wavelengths of 2000 to 12000Å, the surface layer of the semiconductor to be annealed can be heated in a short time without fusing it. Thus, there are very desirable corresponding relationships between the characteristics of the lamp and the semiconductor wafer.

DESCRIPTION OF THE PREFERRED EMBODIMENTS

Figure 1:
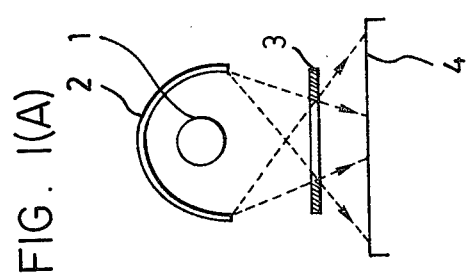
FIGS. 1(A) and (B) are schematic diagrams explanatory of an irradiation system for the present invention.

FIG. 1 is explanatory of an irradiation system, FIG. 1(A) being a schematic diagram of the system as viewed from the lengthwise direction of a long-arc lamp and FIG. 1(B) a schematic diagram of the system as viewed from a direction perpendicular to the lengthwise direction of the long-arc lamp. Reference numeral 1 indicates a long-arc lamp; 2 designates a mirror having a semi-circular cross-section; 3 identifies a slit board provided with an elongated, rectangular hole 7 (see FIG. 3); and 4 denotes a conveyor for carrying a semiconductor wafer (not shown), upon which is formed a slit-like irradiation area 5 as shown in FIG. 2.

Figure 2:
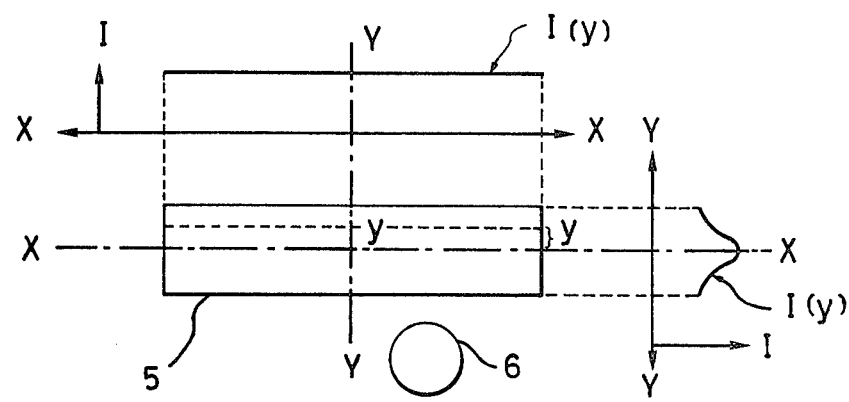
FIG. 2 is a schematic diagram explanatory of the distribution of illumination for the present invention.
Figure 3:
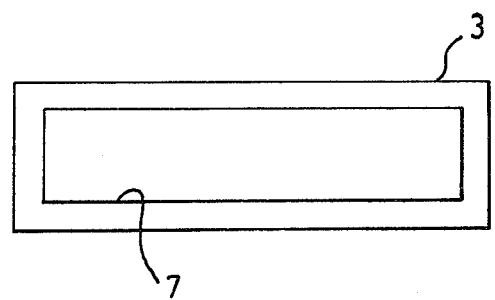
FIG. 3 is a schematic diagram explanatory of a slit board for the present invention.

FIG. 2 is explanatory of the illuminance distribution in the irradiation area 5, X—X being a center axis of the area 5 in its lengthwise direction and Y—Y a center axis in the direction crossing the axis X—X perpendicular thereto. There is formed the irradiation area 5 which possesses a specified illuminance distribution I(y) such that the illuminance distribution $I_{(y)}$ in the X—X direction is substantially constant with respect to any optional value y in the Y—Y direction and the illuminance distribution in the Y—Y direction is expressed as the function of y in respect of any optional value x is in the X—X direction.

A description will be given of the simplest example of the formation of the irradiation area 5 having the abovesaid illuminance distribution. In FIG. 1(A), by using an elliptic mirror as the mirror 2, placing the long-arc lamp 1 at a first focus and installing the slit board of FIG. 3 between the long-arc lamp 1 and the conveyor 4, there is obtained an illuminance distribution indicated by a curve I(y) which is symmetrical in the Y—Y direction with the apex at X—X. And, as a matter of course, with respect to any optional value of y in the Y—Y direction there is produced a fixed illuminance distribution $I_{(y)}$ in the X—X direction. In simple terms, the irradiation area 5 is a slit-like irradiation area in which equiluminous curves $I_{(y)}$ are formed all in parallel.

If a semiconductor wafer 6 is passed through the irradiation area 5 at a specified speed and the whole body of the semiconductor wafer 6 crosses all the equiluminous curves $I_{(y)}$, then the intensity Q of irradiation of the semiconductor wafer 6 by light of the long-arc lamp at any given point or portion of the wafer is, in principle, proportional to $\int I(y)dy$; namely, $$Q \propto \int I(y)dy.$$

Accordingly, the entire area of the semiconductor wafer 6 to be annealed is subjected to almost ideal, uniform annealing.

Figure 4:
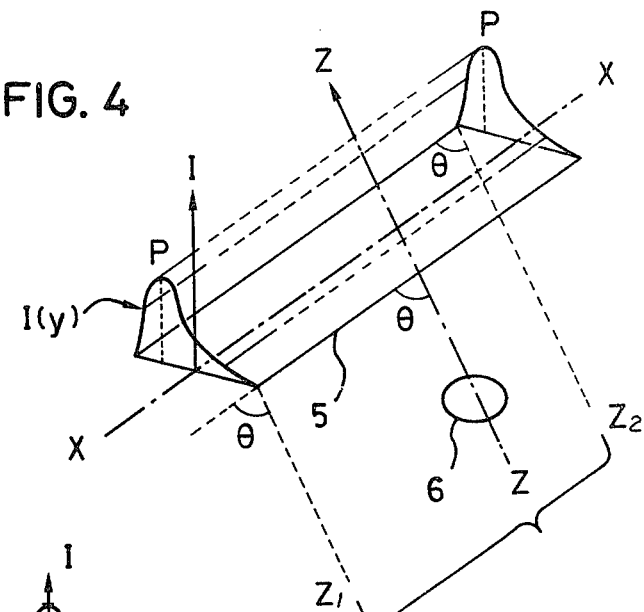
FIG. 4 is a diagram showing the relationship between another distribution of illumination and a mode of shifting a semiconductor wafer for the present invention.

FIG. 4 is explanatory of another example of the illuminance distribution in the irradiation area and the manner of passing therethrough the semiconductor wafer. The illuminance distribution curve I=I(y) is asymmetric with respect to the center axis X—X of the irradiation area 5 in its lengthwise direction, but equiluminous curves extending in the lengthwise direction of the irradiation area 5, $I=I_{(y)}$, are constant in respect of any given values of y; namely, they are many parallel equiluminous curves. In the case where the semiconductor wafer 6 to be annealed passes through the irradiation area 5 at an angle θ to the equiluminous curves, if it passes in an area $Z_1$-$Z_2$ parallel to a passage Z, the entire area of the semiconductor wafer 6 to be annealed traverses all the equiluminous curves in the proximity of the apex P of the illuminance distribution. As a consequence, the irradiation intensity Q on any given point or portion also becomes, in principle, $Q \propto \int I(y)dy$.

In short, the semiconductor wafer can be annealed uniformly over the entire area thereof irrespective of the configuration of the illuminance distribution curve I(y) in the direction Y—Y in which the semiconductor wafer 6 proceeds and the angle θ at which the semiconductor wafer 6 crosses the direction X—X, if the following two conditions are fulfilled:

(a) that the equiluminous curves at and in the vicinity of the apex of the illuminance distribution which the semiconductor wafer crosses be parallel; and (b) that the entire area of the semiconductor wafer to be annealed cross all those equiluminous curves.

A description will be given of an example of the design of the arrangement for the abovesaid annealing. A long-arc type xenon discharge lamp for AC lighting, which satisfies the requirement of 1 KW power consumption, a 160 mm arc length and a 15 mm outer diameter of the bulb, is disposed at a first focus of an aluminum-made elliptic mirror with its second focus falling on a conveyor. The vertical distance L (see FIG. 1(B)) between lamp 1 and the conveyor 4 is made measuring about 100 mm and the length of the mirror is selected at least longer than the arc length. In this case, the central area 120 mm in the X—X direction forms an irradiation area which satisfies the aforesaid requirement (a). In practice, however, after measuring the illuminance distribution on the irradiation area of the conveyor, the width of the passage of the semiconductor wafer which fulfils the requirement (a) is decided. This passage may be defined clearly with the slit board as shown in FIG. 1, or by designing the width of the conveyor to be equal to the abovesaid passage width.

Figure 5:
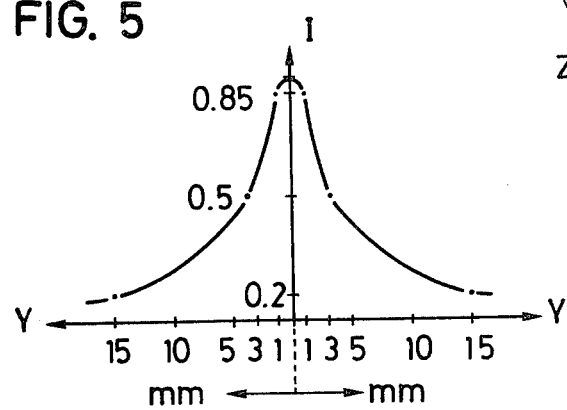
FIG. 5 is a graph explanatory of the converging range of light for the present invention.

The width of converging the emitted light from the lamp in the Y—Y direction is such as shown in FIG. 5, in which the relative center illuminance is 1 (600 joules/$cm^2$ in terms of the absolute value of the irradiation intensity) and the light is focused on an area in the range of 3 mm, in particular, 1 mm around the center. When a 4 in. diameter silicon wafer having implanted therein arsenic in an amount of $10^{14}$ atoms/$cm^2$ by means of ion irradiation is passed through the area of 2 mm around the center along the aforesaid passage at a constant speed of 2 mm/sec., the infinity of the sheet resistance of the silicon wafer drops down to 280 ohms or so, providing that the crystal recovery has sufficiently been done. That is, one-second irradiation can achieve enough annealing of the wafer. And since the amount of energy which is applied to the semiconductor wafer by the one-second irradiation is equal at any point or portion of the wafer, it indicates that the annealing takes place very uniformly over the entire area of the semiconductor wafer.

Moreover, the annealing of semiconductors is sufficient if performed at about 1000° C.; but, the annealing temperature and time are subject to alteration according to the kind of semiconductor to be annealed and the degree of damages to the crystals. In the present invention, it is practical to employ a long-arc lamp with an output as large as several kilowatts, design the mirror to reduce the focusing width as much as possible and change the travelling speed of the conveyor so as to readily control and change the annealing temperature raising rate and the annealing temperature and time for each semiconductor.

Figure 6:
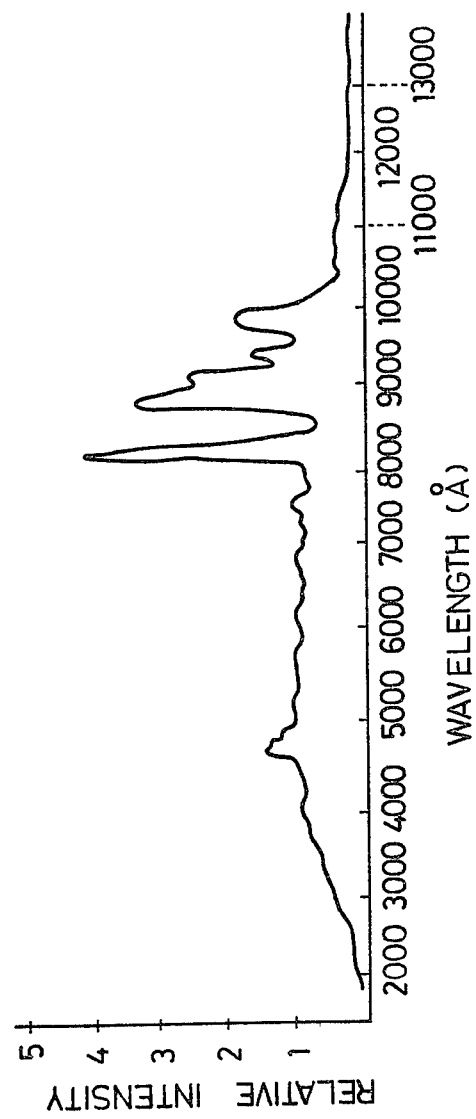
FIG. 6 is a graph showing a spectral emissive characteristic for the present invention.

FIG. 6 shows the spectral emissive characteristic of a large-output, long-arc xenon lamp used for the above-mentioned annealing. This lamp emits, over wavelengths of 2000 to 12000Å, an intense energy necessary for accomplishment of the object of the present invention.

Figure 7:
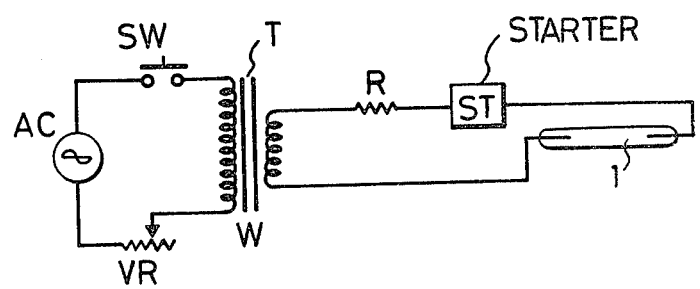
FIG. 7 is a schematic diagram explanatory of a lamp drive power source for the present invention.

FIG. 7 illustrates an example of a power source for driving such a lamp as mentioned above. Reference character T indicates a transformer which is energized by an AC power supply AC. On the primary side of the transformer T, a switch SW and a current regulator VR are provided. The switch SW turns ON and OFF the power supply AC, while the current regulator VR functions to adjust the light which is emitted from the lamp. To the secondary side of the transformer T there is connected the lamp 1 via a balast resistor R and a starter ST.

As has been described in the foregoing, according to the present invention, a semiconductor wafer is annealed in a moment with almost ideal uniformity over its entire area by passing the wafer through a narrow, lamp irradiation area in which the entire area of the wafer to be annealed crosses all of the parallel equiluminous curves. In addition, the annealing temperature raising rate and the annealing temperature and time can easily be controlled as by varying the lamp output, the conveyor travelling speed and so forth. The method of the present invention is extremely ideal and practical for annealing semiconductor wafers.

It will be apparent that many modifications and variations may be effected without departing from the scope of the novel concepts of this invention.

What is claimed is:

1. A uniform, rapid and low-energy semiconductor annealing method comprising the steps of:
   (a) providing an elongated uniform irradiation area by an incoherent light source whose emitted light is controlled so that a peak curve of the illuminance distribution is provided along the elongated irradiation area which is substantially linear and equiluminous curves are provided near the peak curve which are substantially linear and parallel therewith; and
   (b) continuously moving a semiconductor wafer and the elongated irradiation area relative to each other, wherein the entire area of the semiconductor wafer to be annealed transversely crosses all the substantially parallel and linear equiluminous curves for holding the direction in which the temperature distribution over the heated portion of the wafer undergoes wavy variations at a constant angle to the crystal orientation at all points on the wafer surface area and for providing uniform temperature and thermal hysteresis at all points on the wafer surface area, whereby the entire area of the semiconductor wafer is uniformly and rapidly annealed.

2. The method of claim 1, wherein the emitted light exhibits a spectral emission characteristic of intense energy over a wavelength range of 2000 to 12000Å having high absorption for a semiconductor wafer, whereby the semiconductor wafer is both quickly and uniformly annealed.

3. The method of claim 2, wherein the emitted light is produced by a long-arc xenon lamp.

4. The method of claim 3, wherein the emitted light of the elongated irradiation area to anneal the semiconductor wafer is focused by using an elliptic mirror having a first focus at which the lamp is disposed and a second focus falling on the semiconductor wafer.

5. The method of claim 4, wherein the elongated irradiation area is further defined by positioning a slit board between the lamp and the semiconductor wafer.

6. The method of claim 1, 2, 3, 4, or 5, wherein the semiconductor wafer is moved relative to the irradiation area by positioning the wafer on a conveyor so that the wafer moves with the conveyor transversely through the elongated irradiation area at a specified speed crossing all of the substantially parallel equiluminous curves.

7. The method of claim 1, 2, 3, 4, or 5, where in the emitted light of the elongated irradiation area for annealing the semiconductor wafer is readily adjusted using a light adjusting circuit with a drive power source for the light source.

* * * * *

UNITED STATES PATENT AND TRADEMARK OFFICE
CERTIFICATE OF CORRECTION

PATENT NO. : 4,482,395

DATED : Nov. 13, 1984

INVENTOR(S) : Hiramoto

It is certified that error appears in the above-identified patent and that said Letters Patent is hereby corrected as shown below:

Front page [57] ABSTRACT, line 11, after "thereby" delete "to".

Column 1, line 17, "and the other is" should be --with--;

Column 1, line 32, after "annealing." begin new paragraph with "In view of these defects,";

Column 1, line 47, "emloying" should be --employing--;

Column 1, line 54, after "irradiation;" delete "and";

Column 1, line 57, ", and also as a" should be --; and--; then begin new paragraph with --(i) as a--.

Signed and Sealed this

Third Day of September 1985

[SEAL]

Attest:

DONALD J. QUIGG

*Attesting Officer*   Acting Commissioner of Patents and Trademarks - Designate